(12) United States Patent
Romig et al.

(10) Patent No.: US 11,049,836 B2
(45) Date of Patent: Jun. 29, 2021

(54) BOND WIRE SUPPORT SYSTEMS AND METHODS

(71) Applicant: TEXAS INSTRUMENTS INCORPORATED, Dallas, TX (US)

(72) Inventors: Matthew David Romig, Wylie, TX (US); Benjamin Stassen Cook, Addison, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 244 days.

(21) Appl. No.: 15/960,093

(22) Filed: Apr. 23, 2018

(65) Prior Publication Data
US 2019/0326247 A1 Oct. 24, 2019

(51) Int. Cl.
*H01L 23/00* (2006.01)
*H01L 23/495* (2006.01)

(52) U.S. Cl.
CPC ........ *H01L 24/48* (2013.01); *H01L 23/49575* (2013.01); *H01L 24/85* (2013.01); *H01L 2224/48096* (2013.01); *H01L 2224/48137* (2013.01); *H01L 2224/48177* (2013.01); *H01L 2224/48992* (2013.01); *H01L 2224/48997* (2013.01); *H01L 2224/85007* (2013.01); *H01L 2224/85986* (2013.01)

(58) Field of Classification Search
None
See application file for complete search history.

(56) References Cited

U.S. PATENT DOCUMENTS

| | | | | |
|---|---|---|---|---|
| 5,847,445 A | * | 12/1998 | Wark | H01L 23/16 257/669 |
| 2012/0133036 A1 | * | 5/2012 | Camacho | H01L 23/49541 257/676 |
| 2013/0134578 A1 | * | 5/2013 | Tan | H01L 24/85 257/737 |
| 2014/0191417 A1 | * | 7/2014 | Tan | H01L 24/48 257/777 |
| 2016/0118365 A1 | * | 4/2016 | Singh | H01L 24/81 257/676 |
| 2017/0358564 A1 | * | 12/2017 | Lee | H01L 25/0657 |

* cited by examiner

*Primary Examiner* — Mounir S Amer
(74) *Attorney, Agent, or Firm* — Dawn Jos; Charles A. Brill; Frank D. Cimino (57) ABSTRACT

A system includes a substrate; a bond pad; a wire spanning above the substrate, having a first end bonded to the bond pad and a second end extending from the bond pad to terminate in a second end thereof; and a support structure disposed on the substrate, the support structure comprising at least a side wall and extending from the substrate to terminate in an end portion spaced from the substrate to support the wire.

23 Claims, 9 Drawing Sheets

BOND WIRE SUPPORT SYSTEMS AND METHODS

TECHNICAL FIELD

This disclosure relates to bond wire support systems and methods.

BACKGROUND

Wire bonding is a commonly used process for making interconnections between a pair of integrated circuits or other semiconductor devices or between an integrated circuit or another semiconductor device and its substrate during a packaging process. A wire is attached to the pair of integrated circuits using a bonding technique, such as ball bonding, stitch bonding, wedge bonding, or compliant bonding. The packaging process also typically includes a molding step in which the integrated circuits or other semiconductor devices are encapsulated in a protective case. The profile or 3D shape of the wire after bonding and optional encapsulation is very important to it's ability to meet the electrical and mechanical requirements across it's lifetime.

The bond wire may not achieve a desired profile, however, after being encapsulated. For example, because of the limited capability of a wire bonder or because of the insufficient physical strength of the wire, a wire may not maintain a desired profile after being bonded. In some examples, as a result of fluid coming into contact with the bond wire during the packaging step, the bond wire may shift to an undesired position or profile. Shifting of the bond wire may lead to undesired electrical effects, such as a short circuit or leakage to nearby wires or devices. This is especially important in cases where the voltage difference between the wire and another wire or device feature is in the range of 10V to 100,000V and leakage paths can be created in the presence of such an electrical field.

SUMMARY

This disclosure relates to bond wire support systems and methods.

In one example, a system includes a substrate and a bond pad. The system further includes a wire spanning above the substrate, having a first end bonded to the bond pad and a second end extending from the bond pad to terminate in a second end thereof. The system further includes a support structure disposed on the substrate, the support structure comprising at least a side wall and extending from the substrate to terminate in an end portion spaced from the substrate to support the wire.

In another example a semiconductor package includes a leadframe and a die disposed on the leadframe. The system further includes a first bond pad disposed on the die. The system further includes a lead finger disposed on the leadframe. The system further includes a second bond pad disposed on the lead finger. The system further includes a wire having a first end bonded to the first bond pad and a second end bonded to the second bond pad. The system further includes a support structure disposed on one of the leadframe, the die, and the lead finger, the support structure comprising at least a side wall extending from the one of the leadframe, the die, and the lead finger to terminate in an end portion spaced from the substrate to support the wire. The system further includes a casing covering portions of the leadframe, the die, the lead finger, the wire, and the support structure.

In yet another example, a method includes providing a leadframe comprising a lead finger. The method further includes disposing a die on the leadframe using an adhesive material. The method further includes bonding a first end of a wire to a bond pad on the die and bonding a second end of the wire to a bond pad on the lead finger. The method further includes providing a support structure disposed on one of the leadframe, the die, and the lead finger, the support structure comprising at last a side wall extending from the one of the leadframe, the die, and the lead finger to the wire to terminate in an end portion spaced from the substrate to support the wire. The method further includes covering the leadframe, the die, the lead finger, the wire, and the support structure in a semiconductor package.

DETAILED DESCRIPTION

This disclosure provides for a support structure for maintaining a bond wire in a desired profile when interconnecting two substrates. A substrate as used herein may include an integrated circuit, a leadframe, or a lead finger. The support structure also enables the bond wire to hold a desired profile during encapsulation. Thus, the support structure helps prevent undesired electrical effects from occurring. In addition, the support structure may allow for semiconductor designs that may otherwise not have been feasible due to the potential for bond wire shifting. Moreover, the support structure may enable more efficient and faster packaging since undesired electrical effects and undesired wire shifting may become less of a concern.

As will be described, the support structure can include a variety of different geometries. The support structure can also be created using a variety of different materials and processes. For example, the bond wire support structure is fabricated using an additive manufacturing process, such as disclosed herein. Thus, the support structure is versatile in that it may be configured for use in different types of semiconductor packages.

Figure 1:
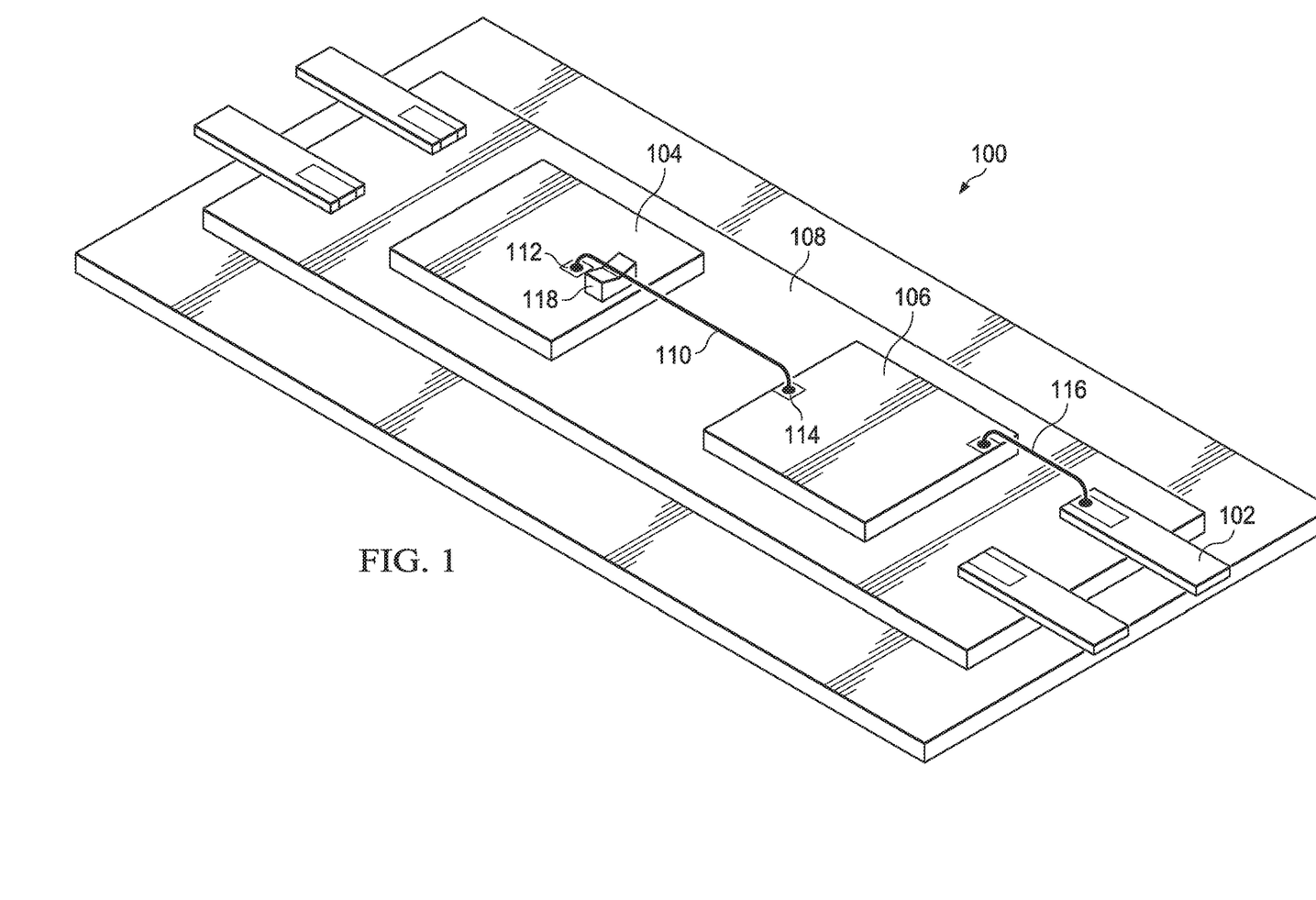
FIG. 1 depicts an example of a semiconductor package.

FIG. 1 depicts an example semiconductor package 100. The semiconductor package 100 may include ceramic, plastic, or another encapsulation material suitable for providing protection for internal components. The semiconductor package includes at least one lead finger (e.g., lead, terminal or lead) 102 configured to electrically connect with external devices or components.

In the example of FIG. 1, the semiconductor package 100 includes a first integrated circuit (IC) microchip 104 (also referred to as a monolithic IC, semiconductor die or chip) and a second integrated circuit microchip 106. Although the example semiconductor package 100 includes two integrated circuit microchips 104 and 106, the semiconductor package 100 may include any number of IC microchips. The integrated circuit microchips 104 and 106 may include a set of electronic circuits configured to provide a variety of functions, such as data storage, sensing, data processing, power supply, and so on.

The semiconductor package 100 also includes a leadframe 108. In one example, the leadframe 108 is made of a single piece of metal such as copper. The integrated circuit microchips 104 and 106 are attached to the leadframe 108. In other words, the integrated circuit microchips 104 and 106 are disposed or mounted on top of the leadframe 108. The integrated circuit microchips 104 and 106 may be positioned in any arrangement on the leadframe 108. In one example, at least one of the integrated circuit microchips 104 and 106 are positioned proximate to at least one lead finger 102 such that the lead finger 102 may facilitate an electrical connection between the at least one of the integrated circuit microchips 104 and 106 and an external device (not shown).

The semiconductor package 100 includes a bond wire 110 configured to electrically couple the first integrated circuit microchip 104 and the second integrated circuit microchip 106. For example, a first end 112 of the bond wire 110 is bonded to and terminates at the first integrated circuit microchip 104 via a first bond pad 113 and a second end 114 of the bond wire 110 is bonded to and terminates at the second integrated circuit microchip 106 via a second bond pad 115. For example, the bond wire 110 may be gold or copper. The bond wire 110 may be bonded using ball bonding, stitch bonding, wedge bonding, or compliant bonding, for example. One or more additional bond wires, such as a second bond wire 116, may similarly be used to electrically couple at least one of the integrated circuit microchips 104 and 106 to at least one of the contacts.

The semiconductor package 100 includes a support structure 118 configured to provide mechanical support for the bond wire 110. In the example of FIG. 1, the support structure 118 is disposed on the first integrated circuit microchip 104 to support the bond wire 110 and thereby retain a desired profile. For example, the bond wire 110 may dip, sag, shift, or otherwise depart from a desired profile, absent the presence of the support structure 118. Although the example semiconductor package 100 illustrates the support structure 118 disposed on the first integrated circuit microchip 104, additionally or alternatively, the support structure 118 may be disposed on the second integrated circuit microchip 106 to provide mechanical support for the bond wire 110. In addition, although the example semiconductor package 100 illustrates the support structure 118 disposed between the bond wire 110 and a surface of the first integrated circuit microchip 104, the support structure 118 may be disposed in alternative positions, such as on the side, suitable for supporting the bond wire 110 at one or more locations along its length.

The support structure 118 may include any suitable material capable of providing mechanical support for the bond wire 110. In one example, the support structure 118 is further configured to provide electrical isolation for the bond wire 110, thus helping to prevent the bond wire 110 from shorting. For example, the support structure 118 is made of an electrically isolating material, such as a polymer-based material (e.g., an epoxy resin). In other examples, the support structure 118 may be made of a polymer resin (including polyimide, epoxy, bismaleimide, poly-4-vinylphenol, acrylate, polydimethylsilixane (silicone) etc. . . . ), an oxide/nitride/ceramic (including silicon dioxide, silicon nitride, aluminum oxide, etc. . . . ), or a carbon allotrope such as graphite which has a very low conductivity. In one example, the support structure 118 provides for electrical insulation to a level of 1 V/um to 1000 V/um through the height of the structure.

The support structure 118 may be any shape or design suitable for providing mechanical support for the bond wire 110. For example, the support structure 118 may vary in length, height, and width depending on the application and the support requirements. Further, the support structure 118 may vary in shape depending on the support requirements. For example, although the example support structure 118 is depicted as having a rectangular shape, the support structure 118 may be cylindrical, round, and so on.

Figure 2A:
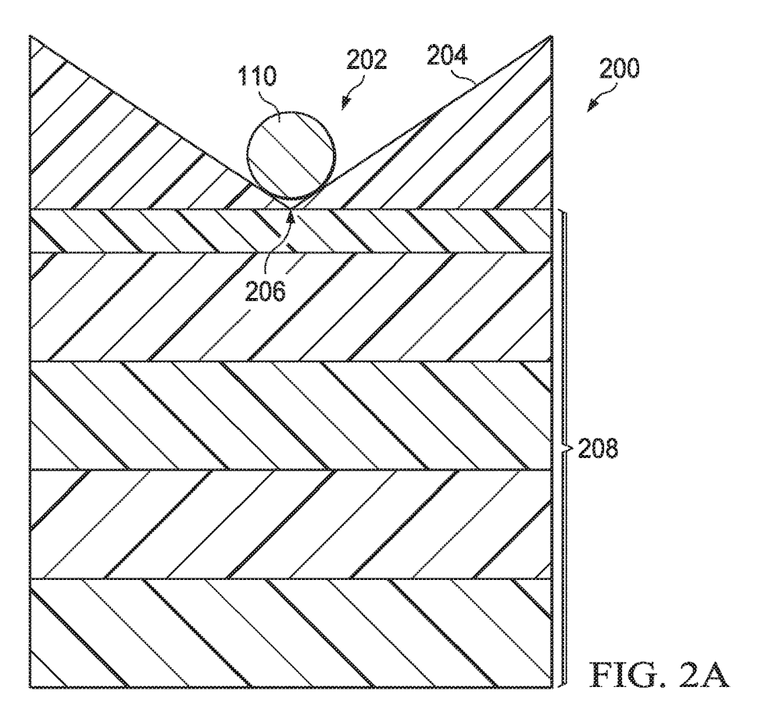
FIG. 2a depicts a cross section view of an example of semiconductor package.

In one example, the support structure 118 may include an additional feature, such as a notch or a groove (not shown), to help the guide the bond wire 110 into a desired position and to help prevent the bond wire 110 from shifting. FIG. 2a illustrates a side view of an example support structure 200 having a notch 202 configured to receive and guide a bond wire 110. For example, the notch 202 includes side walls 204 that are angled or sloped towards a valley 206. The side walls 204 are configured to receive the bond wire 110 as the bond wire 110 comes into proximity of the top of the support structure 200 and to funnel or channel the bond wire 110 in towards the center valley. Thus, the side walls 204 serve as a guide to facilitate receiving the bond wire 110 therein. The side walls 204 are further configured to help prevent the bond wire 110 from shifting to a side, away from the desire position at the support structure 200 once the bond wire 110 is positioned in the valley 206. Although the notch 202 is illustrated as triangular V-shaped in the example of FIG. 2a, including the side walls 204 being linear, angled, and funneling towards a vertex of a valley 206 being pointed thereof, the notch 202 may include other shapes. For example, as illustrated in FIG. 2b, a notch 210 may be semi-circular or U-shaped, with curved side walls 212 for funneling the bond wire 110 down towards a flattened valley 214, which may contact the bond wire 110 to help retain its profile.

In one example, the side walls 204 of the notch 202 may include ridges, protrusions, or other features (not shown) to further urge the bond wire 110 to remain in the valley 206 and to mitigate the bond wire 110 from shifting away from the desire position or profile as it sits within the notch. In one example, the side walls 204 of the notch 202 may include material with increased friction to further aid in preventing the bond wire 110 from sliding out from the valley 206 and away from the desired position or profile. In one example, the support structure 800 may include a top cover or other additional material (not shown) to provide additional support and hold or retain the bond wire 110 into place once the bond wire 110 is in position inside the notch 202.

Figure 2B:
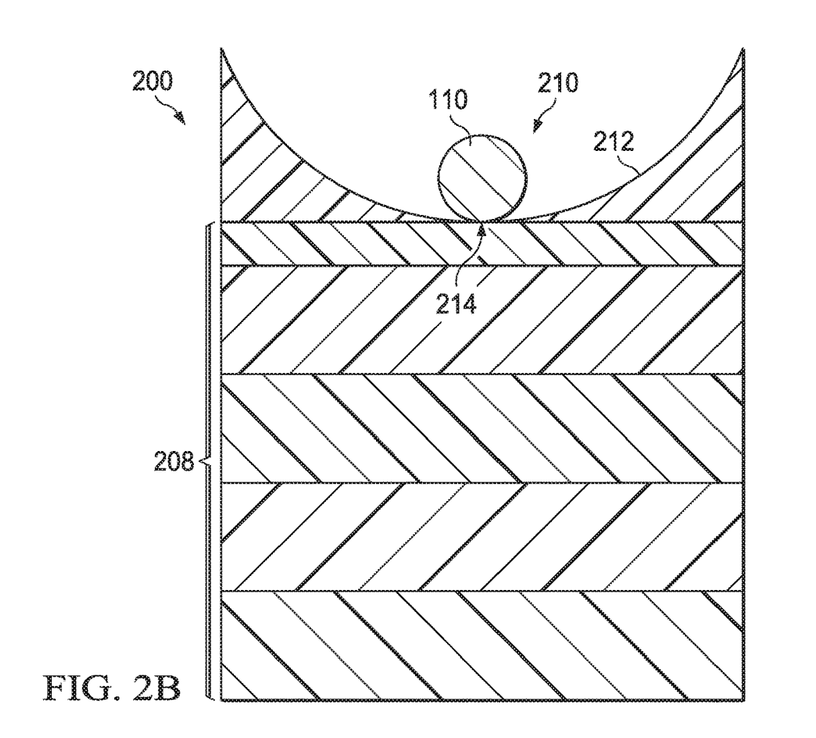
FIG. 2b depicts a cross section view of an example of semiconductor package.

With continued reference to FIG. 1 and FIGS. 2a-b, in one example, the support structure 118 may be 3D fabricated from an epoxy or another polymer based material according to an additive manufacturing process. As an example, the support structure 118 may be printed using Ultra-Violet "(UV)" printing. In other examples, the support structure 118 may be fabricated using other additive manufacturing methods, such as Inkjet, Sterolithography (SLA), Aerosol Jet, Digital Light Processing, Fused Deposition Modeling, Selective Laser Melting, Electronic Beam Melting, Laminated Object Manufacturing, Extrusion, and the like.

In one example, the support structure 118 may be printed, or otherwise manufactured, independently of the first integrated circuit microchip 104. For instance, the support structure 118 may be printed as an individual piece (or in multiple pieces or layers) and configured to be attached to the first integrated circuit microchip 104. For example, the support structure 118 may include an adhesive on a bottom end to enable the support structure 118 to be attached to the first integrated circuit microchip 104 (or other substrate structure where it is disposed).

In another example, the support structure 118 may be printed, or otherwise manufactured, as part of the manufacturing process of the first integrated circuit microchip 104 (or other substrate structure where it is disposed). Since the support structure 118 may be monolithically constructed as part of the first integrated circuit microchip 104, no adhesive or any other types of attachment means would be needed to connect the support structure 118 to the first integrated circuit microchip 104. In other words, the first integrated circuit microchip 104 may itself be integral with the support structure 118. Therefore, no additional printing, manufacturing, connecting, or coupling is required in order to provide a semiconductor package 100 equipped with a support structure 118 when the semiconductor package 100 is assembled.

In another example, the support structure 118 may be printed, or otherwise manufactured, onto an assembled leadframe 108 including the bond wire 110 bonded to the first integrated circuit microchip 104. Thus, the support structure 118 may be a custom printed structure having specific dimensions and characteristics to suit a specific application.

In one example, fabricating the support structure 118 includes printing the support structure 118 by depositing layers of material to form the support structure. The side view of the example support structure 200 of FIG. 2 illustrates multiple layers 208 that have been deposited to form the final support structure 200. For example, successive layers 208 or thinly sliced cross sections of the final support structure 200 are created and stacked according to a predefined design and shape to produce the final support structure 200.

Figure 3:
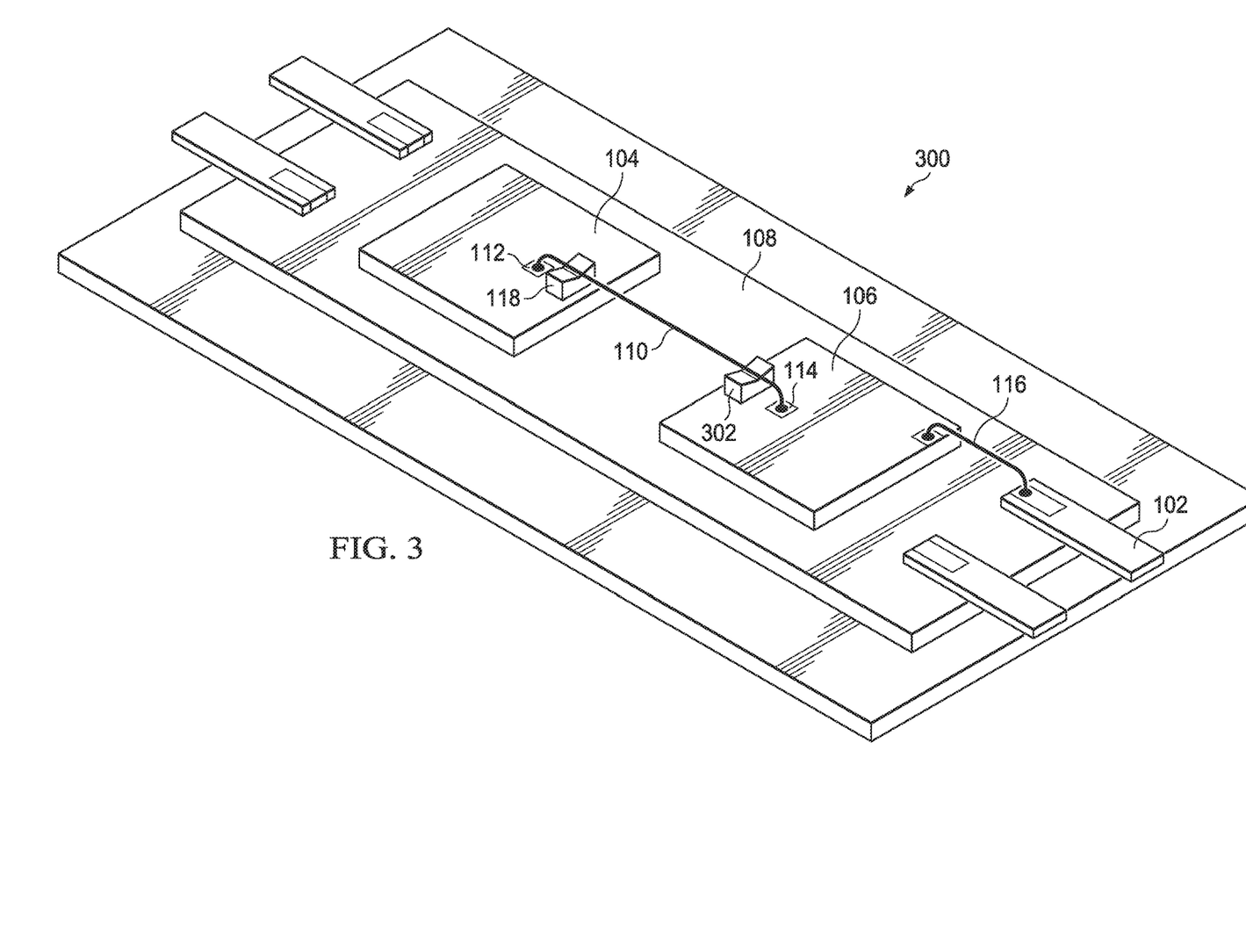
FIG. 3 depicts another example of a semiconductor package.

Although the example semiconductor package 100 illustrated in FIG. 1, includes a single support structure 118 disposed on the first integrated circuit microchip 104, the semiconductor package 100 may include any suitable number of support structures 118 disposed in various suitable arrangements. For example, as illustrated in FIG. 3, a semiconductor package 300 includes the support structure 118 positioned on the first integrated circuit microchip 104 near the first end 112 of the bond wire 110. The semiconductor package 300 further includes a second support structure 302 positioned on the second integrated circuit microchip 106 near the second end 114 of the bond wire 110. Thus, the bond wire 110 is supported structurally at two different locations, which are spaced longitudinally apart from each other along the length of the wire, to further aid the bond wire 110 in forming and maintaining a desired profile.

Figure 4:
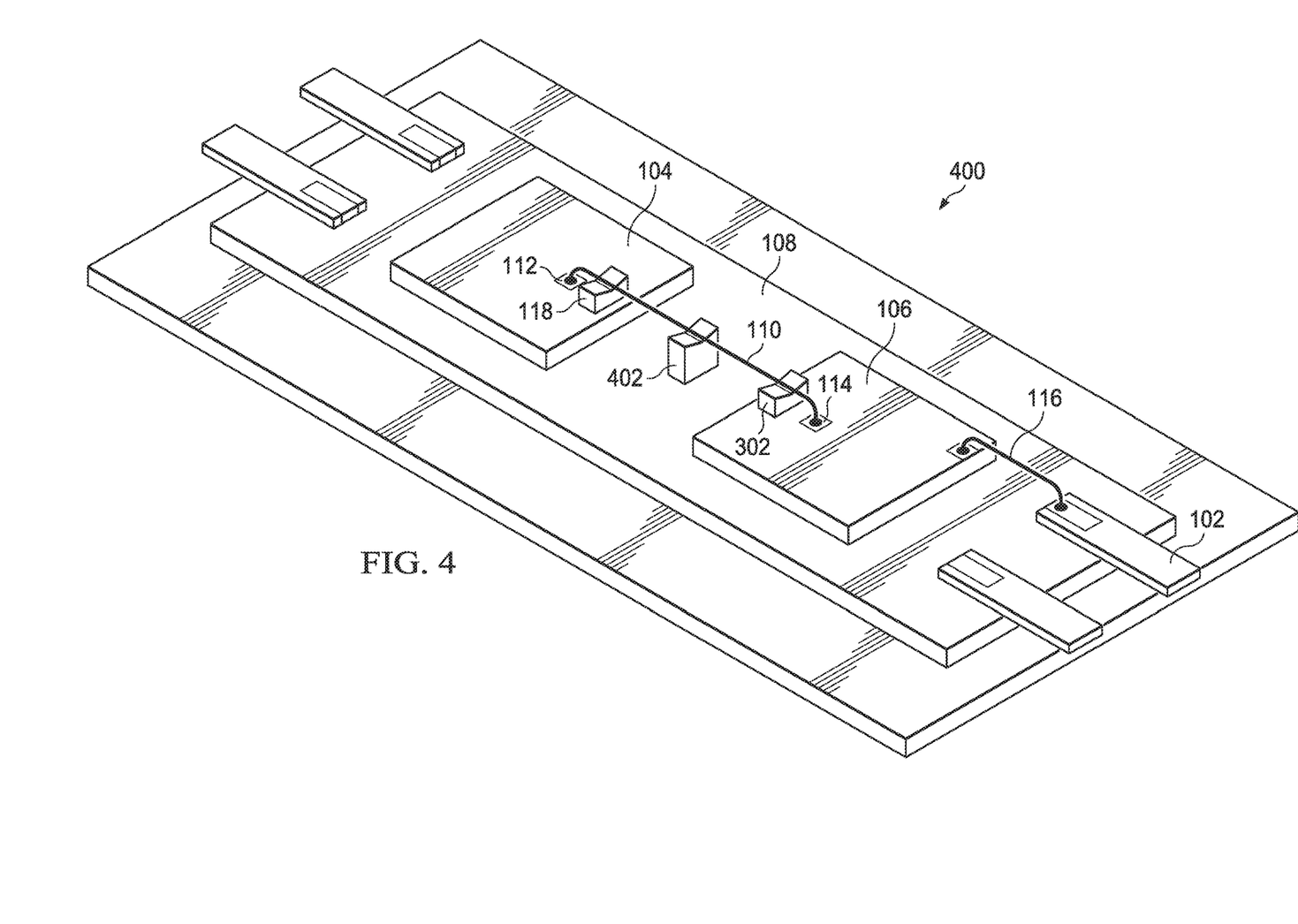
FIG. 4 depicts another example of a semiconductor package.

In another example, as illustrated in FIG. 4, a semiconductor package 400 includes a third support structure 402 disposed on the leadframe 108 at a point in between the first integrated circuit microchip 104 and the second integrated circuit microchip 106. Thus, in addition to the support structure 118 and the second support structure 302 providing support for the bond wire 110 at each of the first end 112 and the second end 114 respectively, the third support structure 402 provides support mid-span between the first end 112 and the second end 114 in order to further aid the bond wire 110 in forming and maintaining a desired profile. Alternatively, in other examples, the third support structure 402 may be used individually (e.g., without including structures 118 and 302) as to support an intermediate portion of the bond wire 110.

Figure 5:
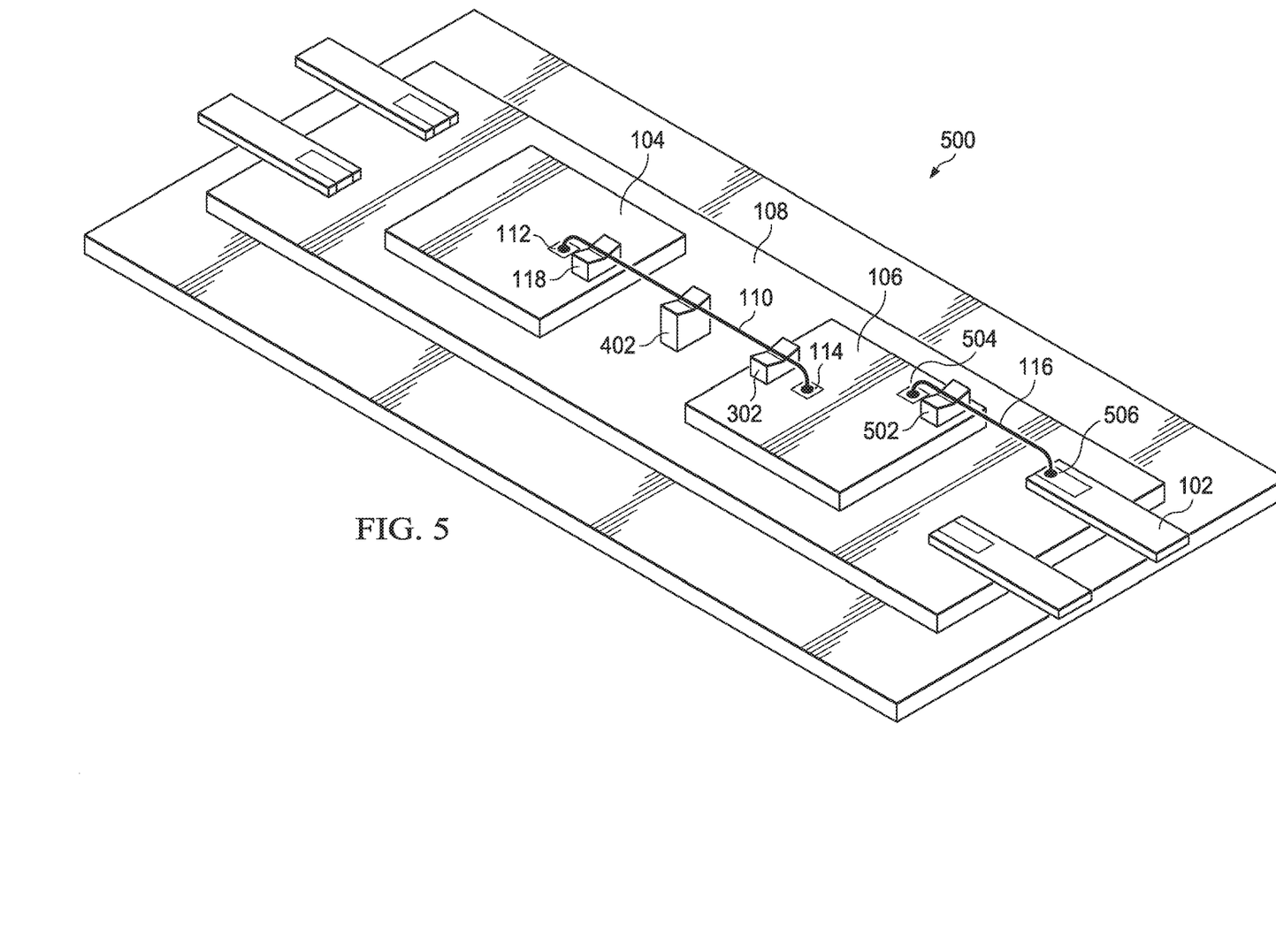
FIG. 5 depicts another example of a semiconductor package.

In another example, a support structure may be used to provide support for a bond wire between two points other than between the first and second integrated circuit microchips 104 and 106, as has been described already. For example, as illustrated in FIG. 5, a semiconductor package 500 may include a fourth support structure 502 disposed on the second integrated circuit microchip 106. The fourth support structure 502 is configured to provide mechanical support for the second bond wire 116 electrically coupling the second integrated circuit microchip 106 and the lead finger 102. Although the fourth support structure 502 is depicted as being disposed on the second integrated circuit microchip 106 near a first end 504 of the second bond wire 116, the fourth support structure 502 may alternatively be disposed on the lead finger 102 near a second end 506 of the second bond wire 116 or on the leadframe 108 between the lead finger 102 and the second integrated circuit microchip 106. In one example, the second bond wire 116 may be supported by multiple support structures (not shown), such as one support structure being positioned near the first end 504 of the second bond wire 116 and another support structure being positioned near the second end 506 of the second bond wire 116. In another example, the second bond wire 116 may be supported by more than two support structures (not shown), including a support structure positioned in mid-span between the first end 504 of the second bond wire 116 and the second end 506 of the second bond wire 116. In yet another example, the fourth support structure 502 may extend along and support a length of the second bond wire 116 between its ends 504 and 506.

It should be appreciated that a support structure positioned at end of a bond wire may serve a different function as compared to a support structure positioned at or near mid-span of the bond wire. For example, a support structure positioned at an end point of a bond wire may serve to electrically isolate the bond wire while a support structure positioned in mid-span of the bond wire may serve to provide mechanical rigidity. Accordingly, in some examples, a support structure positioned at an end of a bond wire may include different features or different material as compared to a support structure positioned in mid-span of the bond wire.

Figure 6:
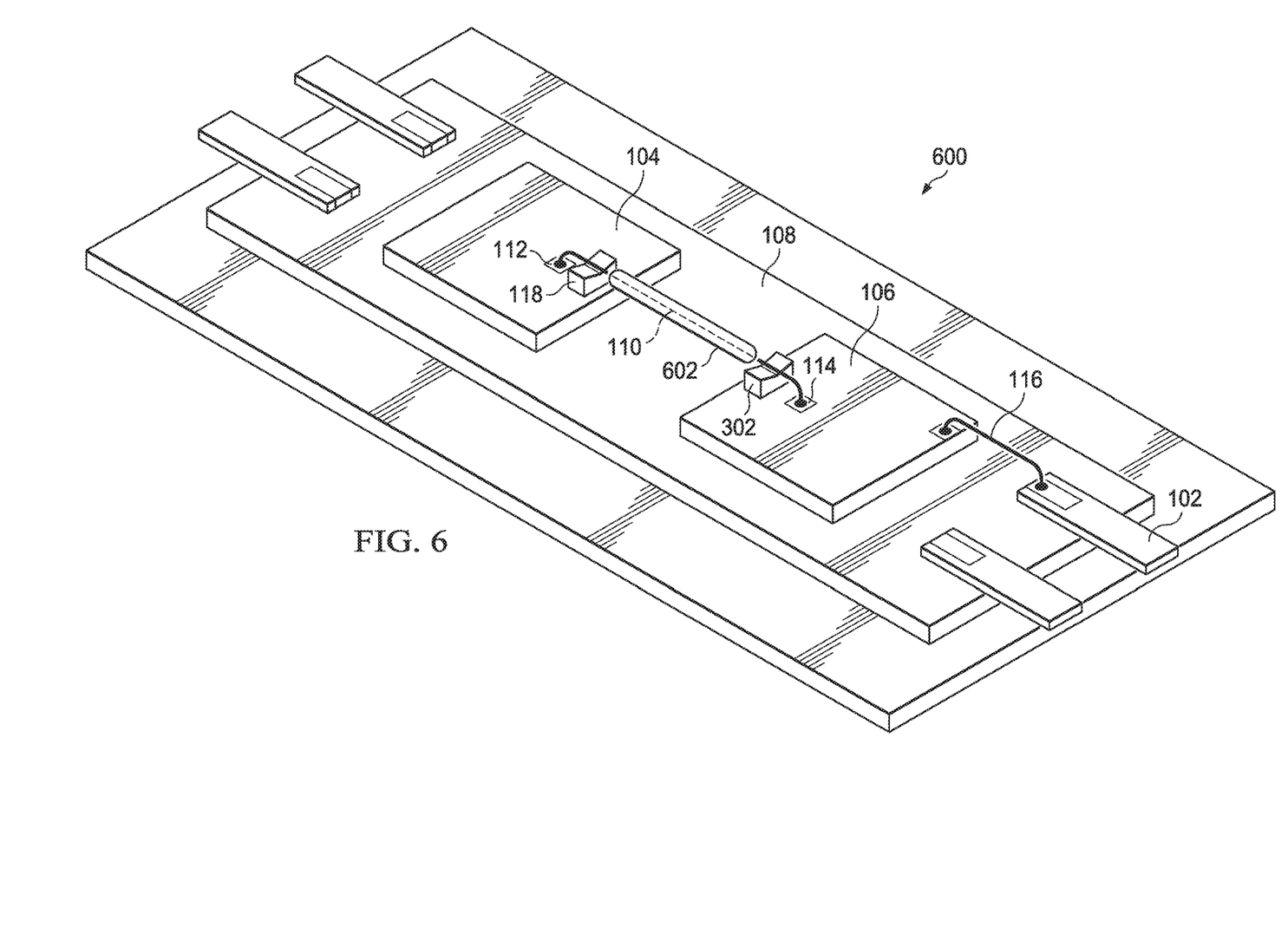
FIG. 6 depicts another example of a semiconductor package.

As a further example, alternative structures may be used to support a bond wire in mid-span. For example, as illustrated in FIG. 6, a semiconductor package 600 may include an elongated sleeve (e.g., a tube) 602 configured to structurally support a length of the bond wire between its ends 112 and 114. In some examples, the sleeve 602 encapsulates or covers at least a portion of the bond wire 110 to help hold the bond wire 110 in a desired profile. In the example of FIG. 6, the sleeve 602 includes an intermediate support portion that extends between the support structure 118 and the second support structure 302 to support a length of the bond wire 110 that extends between support structure 118 and the second support structure 302.

Although the illustrated sleeve 602 extends the entire length of the bond wire 110, such as starting from the support structure 118 and extending to the second support structure 302, in other examples, the sleeve 602 may also be configured to only span a portion of the length of the bond wire 110. For example, the sleeve 602 may extend from the support structure 118 to a midpoint of the bond wire at a distance away from the second support structure 302 (not shown). In another example, the sleeve 602 may extend from a first point at a first distance away from the support structure to a second point at a second distance away from the second support structure (not shown.

As a further example, the sleeve 602 may be configured to encapsulate the entire circumference of the bond wire 110. In another example, the sleeve 602 may encapsulate a portion of the circumference of the bond wire 110. For example, the sleeve 602 may be a half pipe shape providing support to the bottom of underside of the bond wire 110 but leaving exposed the top side of the bond wire 110 (e.g., similar to the U-shaped or V-shaped cross sectional shape described with respect to the support structure of FIG. 2).

In one example, the sleeve 602 is 3D printed around the bond wire 110 after the bond wire is positioned. In another example, the sleeve may be pre-printed and configured to receive a wire prior to the wire being positioned and bonded. In one example, the sleeve 602 is formed of an electrically insulating material and thus may provide electrical isolation for the bond wire 110. Although the semiconductor package 600 includes the support structure 118 and the second support structure 302 positioned at the ends of the bond wire 110, the sleeve 602 may also encapsulate the bond wire 110 in alternative configurations. For example, the sleeve 602 may be configured as a stand-alone support, such that the sleeve 602 includes at least one support (not shown) disposed on the surface of the leadframe 108 between the first and second integrated circuit microchips 104 and 106 and/or on the surface of one or both microchips.

Figure 7:
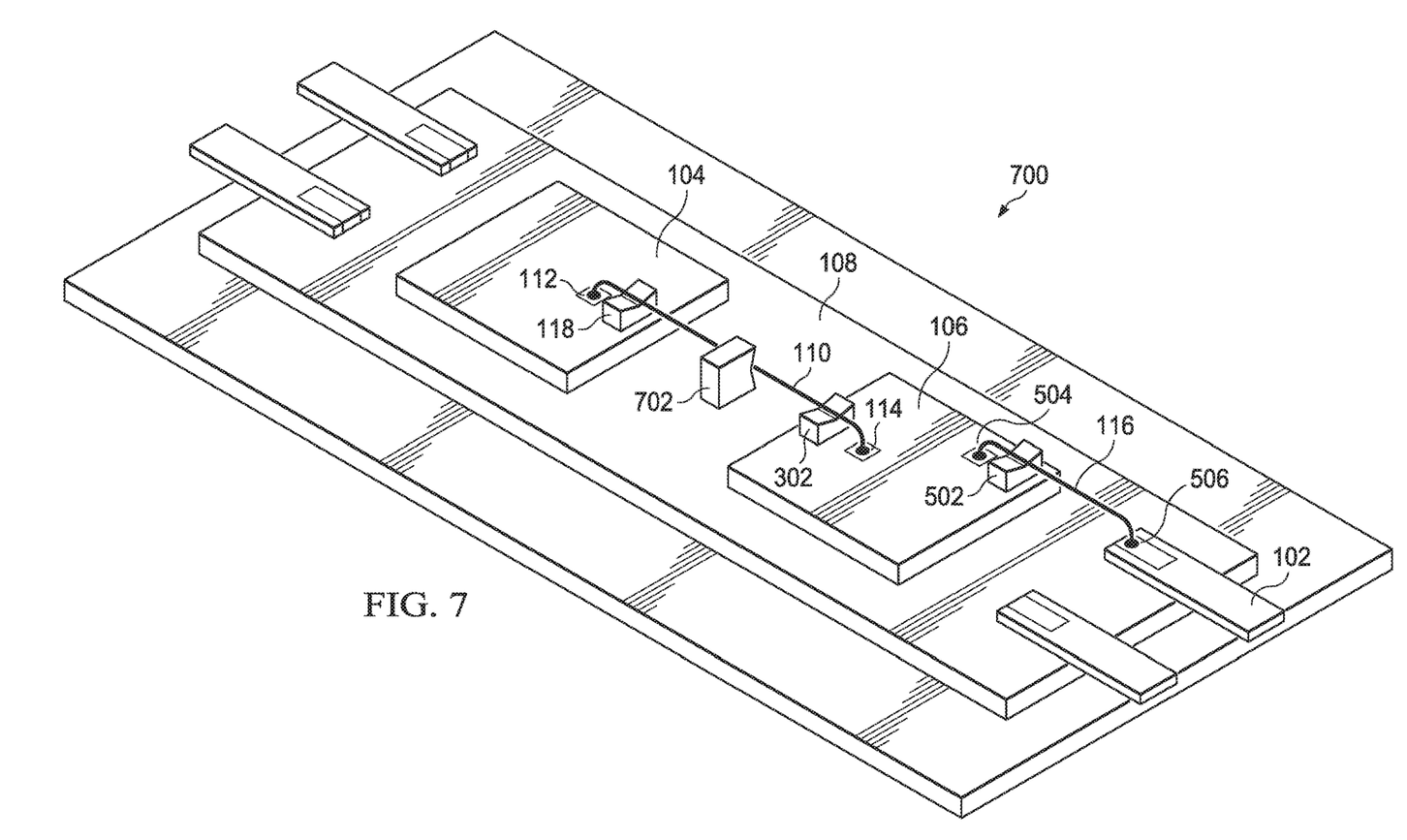
FIG. 7 depicts another example of a semiconductor package.
Figure 8:
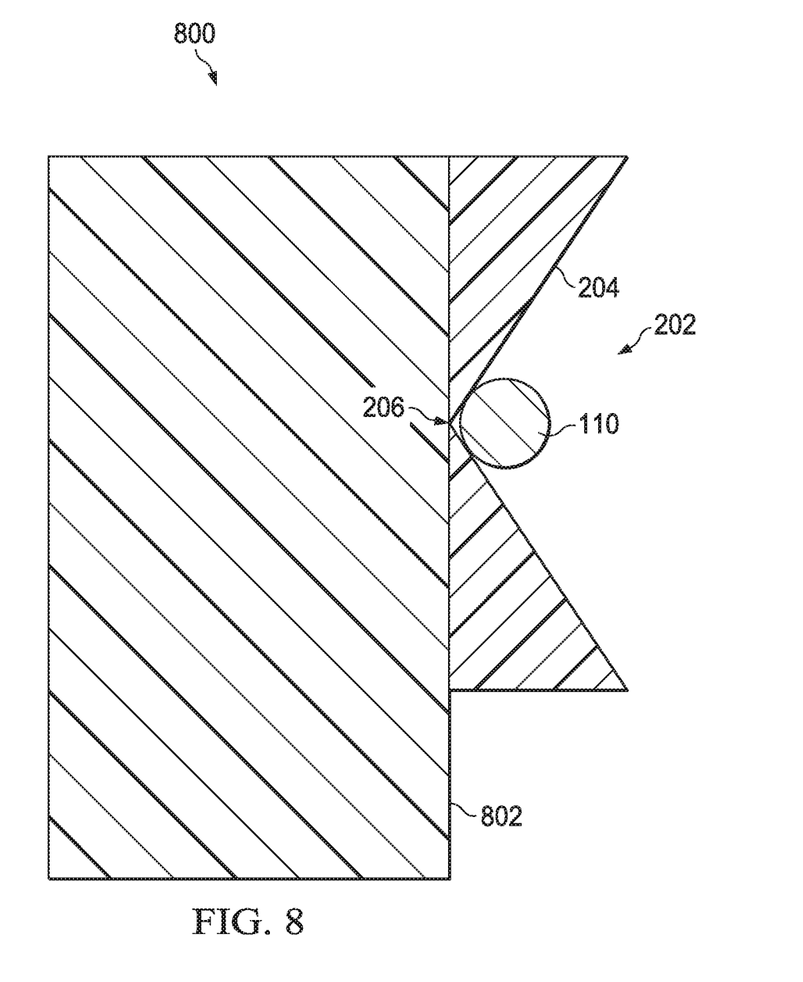
FIG. 8 depicts another example of a semiconductor package.

In another example, a semiconductor package 700 may include a support structure 702 configured to provide support on the side of a bond wire 110. FIG. 8 illustrates a side view of an example support structure 800 having a notch 202 configured to receive and guide a bond wire 110 on the side 802 of the support structure. In particular, the notch 202 including side walls 204 angled towards the center valley 206 are disposed on the side 802 of the support structure 800 and configured to receive the bond wire 110 as the bond wire 110 comes into proximity of the side 802 of the support structure 800. In one example, the support structure 800 may include a top cover or other additional material (not shown) to provide additional support and hold or retain the bond wire 110 into place once the bond wire 110 is in position inside the notch 202.

Figure 9:
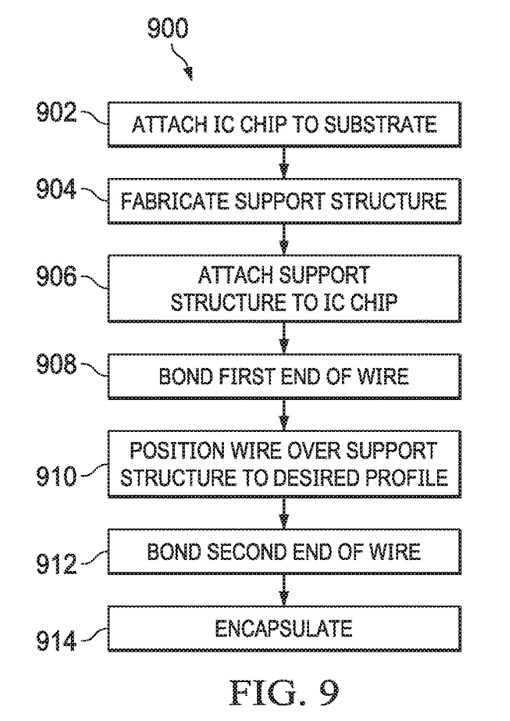
FIG. 9 is a flow diagram depicting an example method for assembling the semiconductor package of FIG. 1.

FIG. 9 is a flow diagram depicting an example of a method 900 for assembling the semiconductor package 100 of FIG. 1. Although specific reference is made to the example semiconductor package 100 of FIG. 1, the example methods described may similarly be implemented for assembling other example semiconductor packages such as semiconductor packages 300, 400, 500, 600, 700 and 800 illustrated in FIGS. 3-8, respectively. At 902, the first integrated circuit microchip 104 and the second integrated circuit microchip 106 are attached to the leadframe 108.

At 904, the support structure 118 is manufactured. In one example, the support structure 118 is 3D printed from an epoxy or another polymer based material. In one example, manufacturing the support structure includes adding an adhesive to the bottom of the support structure. At 906, the support structure 118 is attached to the first integrated circuit microchip 104. The support structure 118 may be attached using an adhesive, for example. In one example, printing the support structure 118 includes printing the support structure 118 directly onto the first integrated circuit microchip 104, thereby eliminating the step of attaching the support structure to the first integrated circuit microchip 104. In another example, the support structure bonds to the surface where it is disposed according to the fabrication method being used.

At 908, the first end 112 of the bond wire 110 is bonded to the first integrated circuit microchip 104. At 910, the bond wire 110 is positioned over top of the support structure 118 to form a desired profile. In one example, positioning the bond wire 110 includes placing the bond wire 110 into the notch 202 of the support structure 118. In one example, positioning the bond wire 110 includes pulling the bond wire tight over the support structure 118 to remove slack. At 912, the second end 114 of the bond wire 110 is bonded to the second integrated circuit chip 106. In one example, the order of bonding the first and second ends 112 and 114 may be reversed. For example, the second end 114 of the bond wire 110 may be bonded to the second integrated circuit chip 106 first before positioning the bond wire 110 over the support structure 118 and finally bonding the first end 112 of the bond wire 110 to the first integrated circuit microchip 104. In one example, additional support can be added above the bond wire 110 to secure or hold in the bond wire 110 to the support structure 118.

At 914, the assembly including the first and second integrated circuit microchips 104 and 106, the leadframe 108, the bond wire 110, and the support structure 118 are encapsulated to form a semiconductor package (e.g., the package 100). The encapsulating may include, for example, encapsulating the components in plastic, or a ceramic casing.

Figure 10:
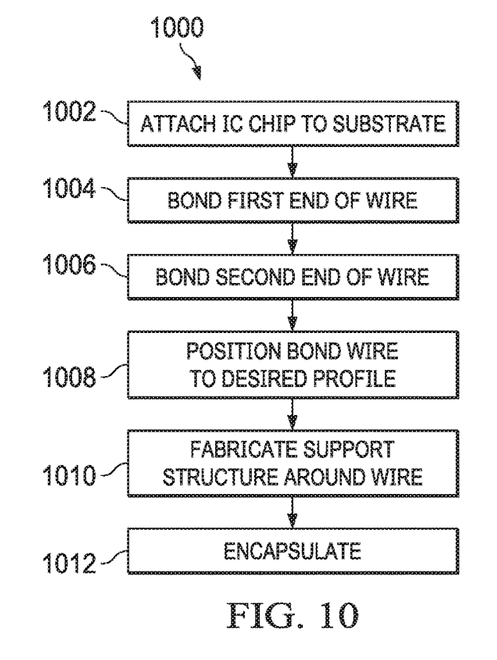
FIG. 10 is a flow diagram depicting another example method for assembling the semiconductor package of FIG. 1.

FIG. 10 is a flow diagram depicting another example of a method 1000 for assembling the semiconductor package 100 of FIG. 1. At 1002, a first IC microchip (e.g., first integrated circuit microchip 104) and the second IC chip (e.g., second integrated circuit microchip 104) are attached to a leadframe (e.g., leadframe 108). At 1004, a first end of the bond wire (e.g., bond wire 110) is bonded to the first IC microchip. At 1006, the second end (e.g., end 114) of the bond wire is bonded to the second integrated circuit chip 106. In one example, the order of bonding the first and second ends may be reversed from that shown and described in FIG. 10.

At 1008, the bond wire is configured to form a desired profile. Once the desired profile is achieved, at 1010, a support structure (e.g., support structure 118) is printed or otherwise manufactured to support an intermediate portion the bond wire. For example, as disclosed herein, the support structure 118 retains the bond wire 110 in the desired profile position. At 1012, the assembly including the first and second IC microchips, the leadframe, the bond wire, and the support structure are encased (e.g., encapsulated) to form the semiconductor package 100.

Figure 11:
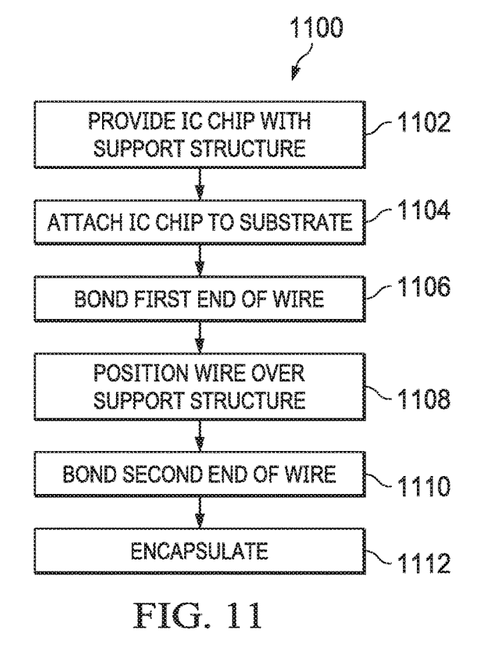
FIG. 11 is a flow diagram depicting another example method for assembling the semiconductor package of FIG. 1.

FIG. 11 is a flow diagram depicting another example of a method 1100 for assembling a semiconductor package, such as the semiconductor package 100 of FIG. 1. At 1102, a first semiconductor chip (e.g., first integrated circuit microchip 104) and a second semiconductor chip (e.g., second integrated circuit microchip 106) are provided, the first semiconductor chip including a support structure (e.g., support structure 118). In one example, the first semiconductor chip is manufactured to include the support structure such that a combination of the first semiconductor chip and the support structure are provided for assembly as a single item or unit (e.g., an integral, monolithic structure). In another example, the support structure is independently manufactured and then attached to the first semiconductor chip such that the combination of the first semiconductor chip 104 and the support structure 118 are provided for assembly as a single item or unit. At 1104, the first IC microchip and the second integrated circuit chip 106 are attached to a leadframe (e.g., leadframe 108). At 1106, a first end (e.g., end 112) of the bond wire is bonded to the first IC microchip. At 1108, the bond wire is positioned over top of the support structure to form a desired profile for the bond wire. In one example, positioning the bond wire includes placing the bond wire into a notch (e.g., notch 202) of the support structure, such that an inner surface of the notch holds (e.g., engages) a portion of the bond wire. In an example, positioning the bond wire includes pulling the bond wire tight over the support structure to remove slack. At 1110, the second end (e.g., end 114) of the bond wire is bonded to the second integrated circuit chip. In one example, the order of bonding the first and second ends (e.g., ends 112 and 114) may be reversed. For example, the second end 114 of the bond wire 110 may be bonded to the second integrated circuit chip 106 first before positioning the bond wire 110 over the support structure 118 and finally bonding the first end 112 of the bond wire 110 to the first integrated circuit microchip 104.

At 1112, the assembly including the first and second integrated circuit microchips 104 and 106, the leadframe 108, the bond wire 110, and the support structure 118 are encased (e.g., via encapsulation) to form the semiconductor package 100.

It should be appreciated that the methods 900, 1000, and 1100 described above may be combined or repeated one or more times in order to assemble a semiconductor package with a more than 1 support structure.

Although the example methods described herein have been described as a series of steps, the series of steps in each method do not necessarily occur in the order described. For example, in practice, the order of the steps of the methods described herein may deviate from the order in which they have been described. Additionally, or alternatively, some actions may be omitted from the method.

In view of the foregoing, systems and methods disclosed herein provide for a 3D printed support structure that enables a bond wire to achieve and maintain a desired profile in a semiconductor package while also electrically isolating the bond wire. As a result, the 3D printed support structure helps to prevent undesired electrical effects from occurring. Additionally, the 3D printed support structure may allow for semiconductor designs that may otherwise not have been feasible due to the potential for bond wire shifting absent the support structure. Moreover, the 3D printed support structure may enable more efficient and faster packaging since undesired electrical effects and undesired wire shifting may become less of a concern.

What have been described above are examples. It is, of course, not possible to describe every conceivable combination of components or methodologies, but one of ordinary skill in the art will recognize that many further combinations and permutations are possible. Accordingly, the disclosure is intended to embrace all such alterations, modifications, and variations that fall within the scope of this application, including the appended claims. As used herein, the term "includes" means includes but not limited to, the term "including" means including but not limited to. The term "based on" means based at least in part on. Additionally, where the disclosure or claims recite "a," "an," "a first," or "another" element, or the equivalent thereof, it should be interpreted to include one or more than one such element, neither requiring nor excluding two or more such elements.

What is claimed is:

1. A system comprising:
    a substrate;
    a bond pad;
    a wire, spanning above the substrate, having a first end bonded to the bond pad and extending from the bond pad to terminate at a second end thereof; and
    a support structure disposed on the substrate, the support structure comprising at least two side walls, the at least two side walls defining a notch therebetween, wherein the wire extends through the notch and is in physical contact with a bottom surface of the notch.

2. The system of claim 1, wherein the substrate comprises at least one of an integrated circuit microchip, a leadframe, or a lead finger.

3. The system of claim 2, wherein the substrate comprises a monolithic structure, and wherein the leadframe comprises the lead finger.

4. The system of claim 1, wherein the substrate is a first substrate, the system further comprising a second substrate, wherein the first substrate comprises a leadframe, wherein the second substrate comprises an integrated circuit microchip supported by the leadframe, wherein the bond pad is disposed on the integrated circuit microchip, and wherein the support structure is disposed proximate to the bond pad.

5. The system of claim 4, further comprising a third substrate, wherein the third substrate comprises a lead finger supported by the leadframe, and wherein the second end of the wire is bonded to the lead finger.

6. The system of claim 4, further comprising a third substrate, wherein the third substrate comprises a second integrated circuit microchip supported by the leadframe, and wherein the second end of the wire is bonded to a second bond pad disposed on the second integrated circuit microchip.

7. The system of claim 4, further comprising a third substrate, wherein the first substrate comprises a leadframe, wherein the second substrate comprises a first integrated circuit microchip supported by the leadframe, wherein the second substrate comprises a second integrated circuit microchip supported by the leadframe, wherein the bond pad is disposed on the first integrated circuit microchip, wherein the second end of the wire is bonded to a second bond pad disposed on the second integrated circuit microchip, and wherein the support structure is disposed on the leadframe in between the first integrated circuit microchip and the second integrated circuit microchip.

8. The system of claim 1, wherein the notch comprises one of a U-shape or a V-shape.

9. The system of claim 1, wherein the support structure comprises one of a circular-shaped pillar, an oval-shaped pillar, a rectangular-shaped pillar, or a square-shaped pillar.

10. The system of claim 1, wherein the support structure comprises a plurality of layers stacked on top of each other between the substrate and a portion of the wire.

11. The system of claim 1, wherein the support structure comprises electrically isolating material to create electrical insulation to a level of 1 V/um to 1000 V/um through a height of the support structure.

12. The system of claim 1, wherein the support structure is a first support structure, the system further comprising a second support structure, wherein the first support structure is disposed proximate to the first end of the wire and the second support structure is disposed proximate to the second end of the wire.

13. The system of claim 12, further comprising a third support structure extending between the first support structure and the second support structure to support a length of the wire between the first end of the wire and the second end of the wire.

14. The system of claim 13, wherein the third support structure covers at least a portion of a circumference of the wire, and wherein the third support structure spans at least a portion of the length of the wire.

15. A semiconductor package comprising:
a leadframe;
a die disposed on the leadframe;
a first bond pad disposed on the die;
a lead finger disposed on the leadframe;
a second bond pad disposed on the lead finger;
a wire having a first end bonded to the first bond pad and a second end bonded to the second bond pad;
a support structure disposed on one of the leadframe, the die, or the lead finger, the support structure comprising two side walls, the two side walls defining a valley therebetween, wherein the wire extends between the two side walls proximate to the valley; and
a casing covering portions of the leadframe, the die, the lead finger, the wire, and the support structure.

16. The system of claim 1, wherein the two side walls include linear surfaces angled relative to one another.

17. The system of claim 1, wherein the two side walls meet at a vertex.

18. The system of claim 1, wherein the two side walls include concave surfaces.

19. The semiconductor package of claim 15, wherein the support structure comprises a plurality of layers.

20. The semiconductor package of claim 15, wherein the valley comprises one of a U-shape or a V-shape.

21. The semiconductor package of claim 15, wherein the support structure is a first support structure, wherein the semiconductor package further comprises a second support structure and a third support structure, wherein the first support structure is disposed proximate to the first end of the wire, wherein the second support structure is disposed proximate to the second end of the wire, and wherein the third support structure extends between the first support structure and the second support structure and supports a length of the wire between the first end of the wire and the second end of the wire.

22. The semiconductor package of claim 15, wherein the support structure is to protrude, in a first direction, away from the one of the leadframe, the die, or the lead finger on which the support structure is disposed, the two side walls oriented so that the valley opens in a direction corresponding to the first direction.

23. The semiconductor package of claim 15, wherein the support structure is to protrude, in a first direction, away from the one of the leadframe, the die, or the lead finger on which the support structure is disposed, the two side walls oriented so that the valley opens in a direction transverse to the first direction.

* * * * *